United States Patent
Karaiskaj

(10) Patent No.: US 9,052,698 B1
(45) Date of Patent: Jun. 9, 2015

(54) ATOMIC CLOCK USING A PHOTODETECTOR

(71) Applicant: Denis Karaiskaj, Wesley Chapel, FL (US)

(72) Inventor: Denis Karaiskaj, Wesley Chapel, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 14/607,338

(22) Filed: Jan. 28, 2015

Related U.S. Application Data

(60) Provisional application No. 62/014,353, filed on Jun. 19, 2014.

(51) Int. Cl.
*G04F 5/14* (2006.01)
*H03L 7/26* (2006.01)

(52) U.S. Cl.
CPC .. *G04F 5/14* (2013.01); *H03L 7/26* (2013.01); *G04F 5/145* (2013.01)

(58) Field of Classification Search
CPC .............. G04F 5/14; G04F 5/145; H03L 7/26
USPC .................................................. 331/94.1, 3
See application file for complete search history.

(56) References Cited

U.S. PATENT DOCUMENTS

| | | | |
|---|---|---|---|
| 6,653,658 B2 | 11/2003 | Burden | |
| 6,867,459 B2 | 3/2005 | Burden | |
| 7,030,704 B2 | 4/2006 | White | |
| 7,619,485 B2 | 11/2009 | DeNatale et al. | |
| 7,852,163 B2 | 12/2010 | Braun et al. | |
| 8,299,858 B2 | 10/2012 | Gan | |
| 8,816,784 B1 * | 8/2014 | Karaiskaj | 331/94.1 |
| 2010/0321117 A1 | 12/2010 | Gan | |

OTHER PUBLICATIONS

Wolfowicz, Gary, et al., "Atomic Clock Transitions in Silicon-Based Spin Qubits,", Nature Nanotechnology, vol. 8, Aug. 2013, pp. 561-564.

Yang A., Steger M., Karaiskaj D., Thewalt M. L. W., Cardona M., Itoh K. M., Riemann H., Abrosimov N. V., Churbanov M. F., Gusev A. V., Bulanov A. D., Kaliteevskii A. K., Godisov O. N., Becker P., Pohl H.-J., Ager J. W., and Haller E. E., "Optical Detection and Ionization of Donors in Specific Electronic and Nuclear Spin States" Phys. Rev. Lett. 97, 227401 (2006).

M. Steger, T. Sekiguchi, A. Yang, K. Saeedi, M. E. Hayden, M. L. W. Thewalt, K. M. Itoh, H. Riemann, N. V. Abrosimov, P. Becker, and H.-J. Pohl, "Optically-detected NMR of optically-hyperpolarized 31P neutral donors in 28Si" J. Appl. Phys. 109, 102411 (2011).

Steger M., Yang A., Thewalt M. L. W., Cardona M., Riemann H., Abrosimov N. V., Churbanov M. F., Gusev A. V., Bulanov A. D., Kovalev I. D., Kaliteevskii A. K., Godisov O. N., Becker P., Pohl H.-J., Haller E. E., and Ager J. W., "High-resolution absorption spectroscopy of the deep impurities S and Se in 28Si revealing the 77Se hyperfine splitting" Phys. Rev. B 80, 115204 (2009).

(Continued)

*Primary Examiner* — Ryan Johnson
(74) *Attorney, Agent, or Firm* — Thomas | Horstemeyer, LLP

(57) ABSTRACT

In one embodiment, an atomic clock for use in an electronic device includes a photodetector with a single-isotope silicon crystal doped with impurity atoms in which a photocurrent generated via a two-photon process within the photodetector is used as a frequency resonance of the atomic clock.

20 Claims, 7 Drawing Sheets

(56) References Cited

OTHER PUBLICATIONS

Sekiguchi T., Steger M., Saeedi K., Thewalt M. L. W., Riemann H., Abrosimov N. V., and Nötzel N., "Hyperfine Structure and Nuclear Hyperpolarization Observed in the Bound Exciton Luminescence of Bi Donors in Natural Si" Phys. Rev. Lett. 104, 137402 (2010).

Abe Eisuke, Tyryshkin Alexei M., Tojo Shinichi, Morton John J. L., Witzel Wayne M., Fujimoto Akira, Ager Joel W., Haller Eugene E., Isoya Junichi, Lyon Stephen A., Thewalt Mike L. W., and Itoh Kohei M., "Electron spin coherence of phosphorus donors in silicon: Effect of environmental nuclei" Phys. Rev. B 82, 121201(R) (2010).

A. R. Stegner, H. Tezuka, H. Riemann, N. V. Abrosimov, P. Becker, H.-J. Pohl, M. L. W. Thewalt, K. M. Itoh, and M. S. Brandt, "Correlation of residual impurity concentration and acceptor electron paramagnetic resonance linewidth in isotopically engineered Si" Appl. Phys. Lett. 99, 032101 (2011).

G. Feher, "Electron Spin Resonance Experiments on Donors in Silicon. I. Electronic Structure of Donors by the Electron Nuclear Double Resonance Technique" Phys. Rev. 114, 1219 (1959).

George Richard E., Witzel Wayne, Riemann H., Abrosimov N. V., and Netzel N., Thewalt Mike L. W., and Morton John J. L., "Electron Spin Coherence and Electron Nuclear Double Resonance of Bi Donors in Natural Si", Phys. Rev. Lett. 105, 067601 (2010).

John J. L. Morton, Alexei M. Tyryshkin, Richard M. Brown, Shyam Shankar, Brendon W. Lovett, Arzhang Ardavan, Thomas Schenkel, Eugene E. Haller, Joel W. Ager, and S. A. Lyon, "Solid-state quantum memory using the 31P nuclear spin" Nature 455, 1085-1088 (2008).

G. W. Morley, M. Warner, A. N. Stoneham, P.T. Greenland, J.v. Tol. C.W. M. Kay, and G. Aeppli, "The initialization and manipulation of quantum information stored in silicon by bismuth dopants", Nat. Mat. 9, 725 (2010).

Hiroki Morishita, Eisuke Abe, Waseem Akhtar, Leonid S. Vlasenko, Akira Fujimoto, Kentarou Sawano, Yasuhiro Shiraki, Lukas Dreher, Helge Riemann, Nikolai V. Abrosimov, Peter Becker, Hans-J. Pohl, Mike L. W. Thewalt, Martin S. Brandt, and Kohei M. Itoh, "Linewidth of Low-Field Electrically Detected Magnetic Resonance of Phosphorus in Isotopically Controlled Silicon" Applied Physics Express 4, 021302 (2011).

Morishita H., Vlasenko L. S., Tanaka H., Semba K., Sawano K., Shiraki Y., Eto M., and Itoh K. M., "Electrical detection and magnetic-field control of spin states in phosphorus-doped silicon" Phys. Rev. B 80, 205206 (2009).

W. Akhtar, H. Morishita, L.S. Vlasenko, D.S. Poloskin, and K. M. Itoh, "Electrically detected magnetic resonance of phosphorousduetospin dependent recombination with triplet centers in g-irradiated silicon" Physica B 404, 4583 (2009).

Yang A., Steger M., Sekiguchi T., Karaiskaj D., Thewalt M. L. W., Cardona M., Itoh K. M., Riemann H., Abrosimov N. V., Churbanov M. F., Gusev A. V., Bulanov A. D., Kovalev I. D., Kaliteevskii A. K., Godisov O. N., Becker P., Pohl H.-J., Ager J. W., and Haller, E. E., "Single-frequency laser spectroscopy of the boron bound exciton in 28Si" Phys. Rev. B 80, 195203 (2009).

Steger, et al., "Quantum Information Storage for over 180s Using Donor Spins in a 28Si Semiconductor Vacuum," Jun. 8, 2012, vol. 33, Science AAAS.

Michael Thewalt, "Abstract Submitted for the Marsh 13 Meeting of the American Physical Society," Nov. 12, 2012.

George, et al., "Electron Spin Coherence and Electron Nuclear Double Resonance of Bi Donors in natural Si", Physical Review Letters 105.6 (2010): 067601, pp. 1-4.

Tyryshkin, et al., "Coherence of Spin Qubits in Silicon", Journal of Physics: Condensed Matter 18.21 (2006): S783-S93.

Taylor, J.M., et al., "High-Sensitivity Diamond Magnetometer with Nanoscale Resolution,", Nature Physics, vol. 4, Oct. 2008, pp. 810-817.

Maze, J R., et al., "Nanoscale Magnetic Sensing with an Individual Electronic Spin in Diamond,", Nature Letters, vol. 455, Oct. 2, 2008, pp. 644-648.

Maletinsky, P., et al., "A Robust Scanning Diamond Sensor for Nanoscale Imaging with Single Nitrogen-Vacancy Centres," Nature Nanotechnology, Letters, vol. 7, May 2012, pp. 320-324.

Budker, Dmitry, et al., "Optical Magnetometry," Nature Physics, vol. 3, Apr. 2007, pp. 227-234.

\* cited by examiner

ATOMIC CLOCK USING A PHOTODETECTOR

CROSS-REFERENCE TO RELATED APPLICATIONS

This application claims priority to co-pending U.S. Provisional Application No. 62/014,353 filed on Jun. 19, 2014 and entitled "Atomic Clock Using a Photodetector," which is incorporated herein by reference in its entirety.

This application is also related to U.S. patent application Ser. No. 14/043,328 filed on Oct. 1, 2013 and entitled "Silicon-Based Atomic Clocks," U.S. patent application Ser. No. 14/041,095 filed on Sep. 30, 2013 and entitled "Silicon-Based Atomic Clocks," U.S. patent application Ser. No. 13/929,146, filed Jun. 27, 2013 and entitled "Silicon-Based Atomic Clocks," and U.S. Provisional Application Ser. No. 61/664,981, filed on Jun. 27, 2012 and entitled "Silicon-Based Atomic Clocks," all of which are hereby incorporated by reference herein in their entirety.

BACKGROUND

The performance of many electronic devices is often limited by the performance of the clocks they use. For example, the receiver in a global positioning system (GPS) works by attempting to align an internally-generated pseudorandom signal to an identical signal sent by a satellite and measuring the phase difference between the two signals. The receiver calculates the time required by the satellite signal to reach the receiver and, thereby gives the distance between the satellite and the receiver. In this system, accurate timing is needed not only for precise determination of distance, but also for fast acquisition of the satellite signal. Other examples in which timing determines the ultimate performance of the system range from parallel analog-to-digital converters to spread-spectrum communications. Furthermore, frequency references provide the basis for a large number of other applications, such as, for example, digital communication, synchronization of networks, and power distribution.

In applications such as those identified above, an atomic clock would greatly enhance the performance of the system. Like quartz oscillators and clocks, atomic clocks function by generating a very stable frequency from a reference. The main difference is that a quartz oscillator derives its frequency from a mechanically vibrating reference, making the frequency sensitive to long-term changes in mechanical dimensions and stress. Alternatively, an atomic clock derives its frequency from the energy difference between atomic states, which is a constant of nature and, therefore, predictable and stable. Unfortunately, size limitations, power consumption, and difficulty to integrate atomic clocks within existing electronic devices have been prohibitive factors for using atomic clocks in such devices.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding, but not necessarily the same, parts throughout the several views.

DETAILED DESCRIPTION

As can be appreciated from the above discussion, it would be desirable to have an atomic clock that can be integrated with existing electronic devices. Described in the following disclosure are photodetector devices that can operate as an atomic clock and are well suited for such integration. The high sensitivity of a photodetector, such as, for example, a p-i-n diode, in the visible spectral range may be used to detect the hyperfine resonance within the photodetector by making use of a rapid two-photon process. As described below, the photodetector devices are desirable not only because of their robustness as compared to gas-based atomic clocks, but also because they can be miniaturized to the point at which they can be incorporated into chip-sized devices.

In the following disclosure, various embodiments are described. It is to be understood that those embodiments are example implementations of the disclosed inventions, and that alternative embodiments are possible. All such embodiments are intended to fall within the scope of this disclosure.

The accuracy of an atomic clock is determined in part by the frequency width of the resonance that it generates when being probed. Generally, the narrower the frequency width, the greater the accuracy of the clock. Resonances due to donors and acceptors in naturally-occurring isotopic silicon are very narrow due in part to the crystalline perfection and chemical purity achieved in the crystal growth of silicon. However, the frequency width of most impurity transitions is wider because of the isotopic randomness of the material.

The advent of isotopically-engineered silicon has made energy level transitions due to impurity dopants possible for atomic clock applications. The resonance frequency width can be substantially narrowed by producing single-isotope silicon crystals. For example, the full width at half maximum (FWHM) of phosphorus bound exciton transitions in single-isotope silicon has been measured to be approximately 2.4 MHz, which is in the order of atomic transitions. Furthermore, hyperfine splitting of 0.12 GHz has been observed at very modest magnetic fields, making isotopically-engineered silicon a candidate for solid-state atomic clocks. In view of this, it is proposed that energy level transitions in silicon can be used as frequency standards for atomic clocks. Example materials, systems, and methods for generating clock signals based upon such transitions are described below.

Figure 1A:
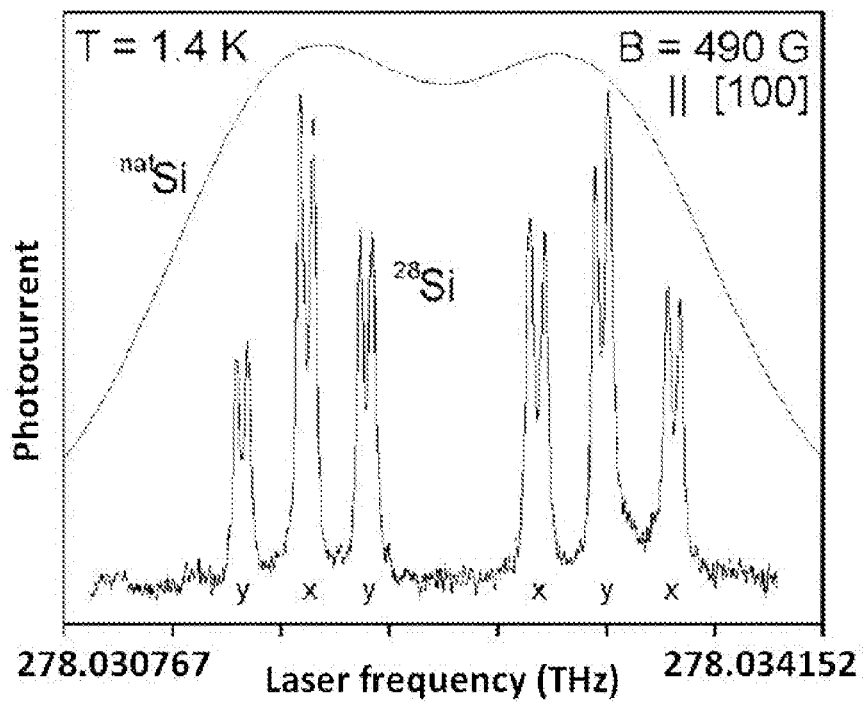
FIG. 1A is a graph that shows the Zeeman spectrum of phosphorus bound exciton, no-phonon transitions in a sample of 99.991% $^{28}$Si.

FIG. 1A shows the Zeeman spectrum of the phosphorus bound exciton, no-phonon transitions in a silicon sample enriched to 99.991% $^{28}$Si. The photoluminescence excitation spectra at T=1.4 K with a magnetic field of 490 G parallel to the [100] axis are shown in the figure. The same spectra obtained in silicon of natural isotopic composition ($^{nat}$Si) are also shown in the figure for purposes of comparison.

Figure 1B:
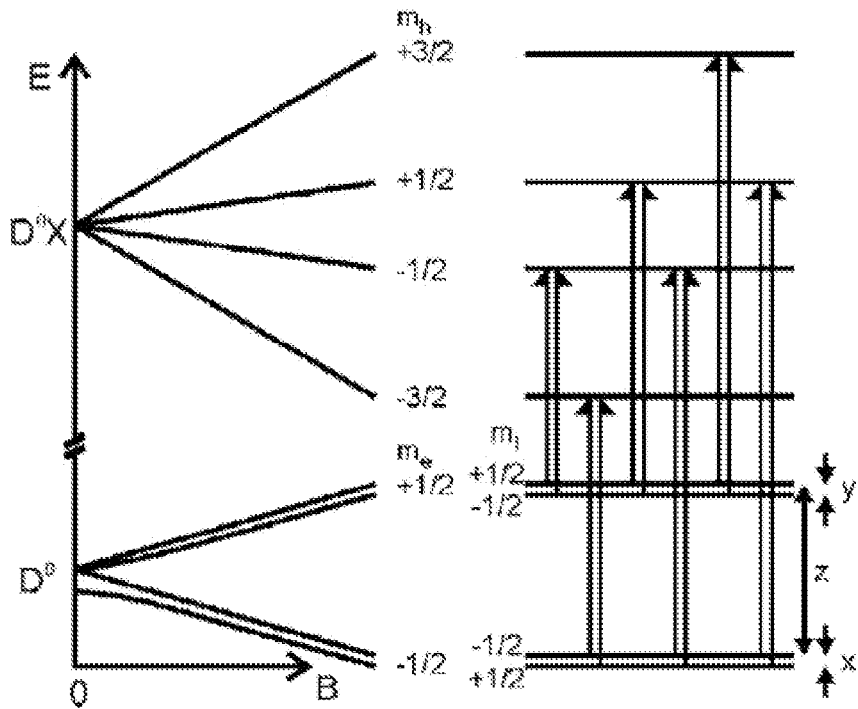
FIG. 1B is a level scheme describing the origin of the transitions of FIG. 1A.

FIG. 1B is a level scheme describing the origin of the transitions (six doublets) shown in FIG. 1A. D$^0$, the neutral donor, is the ground state of the phosphorus bound exciton. D$^0$ has a zero-field hyperfine splitting of 0.12 GHz and, under an applied magnetic field, splits into four hyperfine levels (shown on the right) determined by the projections of the electron spin $m_e = \pm \frac{1}{2}$ and the nuclear spin $m_I = \pm \frac{1}{2}$. The donor bound exciton D$^0$X has two electrons in a spin singlet and, under a magnetic field, splits only according to the j=3/2 hole projections. The six allowed transitions are ordered in increasing energy from left to right, in correspondence with the transitions on the left side of the figure.

As noted above, the stability of an atomic clock is determined in part by the frequency width of the resonance that it generates when probed. Atomic clocks are often characterized by their Allan deviation $\sigma(\tau)$, which is a measure of the fractional frequency stability as a function of averaging time $\tau$. Over short averaging times, the stability of many atomic clocks is characterized by white frequency noise. The Allen deviation is given by $$\sigma(\tau) = \frac{X}{Q\left(\frac{S}{N}\right)} \frac{1}{\sqrt{\tau}}$$

in terms of signal-to-noise ratio SIN and the resonance quality factor Q. The resonance quality is defined as the ratio of resonance frequency $v_0$ over the linewidth $\Delta v$, $Q = v_0/\Delta v$.

In the disclosed systems and methods, the energy level transitions of impurities often found in silicon (Si) are used as a frequency standard for the atomic clocks. Silicon in the naturally-occurring isotopic composition consists of 92.23% $^{28}$Si+4.67% $^{29}$Si+3.10% $^{30}$Si. Therefore, the importance of inhomogeneous isotope broadening effects in setting many of the broadening limits in natural silicon was at first surprising given that natural silicon is close to monoisotopic. However, the vast majority of impurity transitions in natural silicon were found be dominated by isotopic broadening. In addition to significantly broadening the donor and acceptor transitions in the far and near infrared, the isotopic randomness was the origin of the splitting of the ground state of acceptors in silicon. A theoretical framework was developed that provided clear insights on how the isotopic randomness splits the four-fold degenerate ground state of acceptors in natural silicon into doublets. The removal of this remaining source of broadening revealed that impurity transitions in silicon are "atomic like." Therefore, the isotopically purified/enriched versions $^{28}$Si, $^{29}$Si, and $^{30}$Si, and in particular the abundant $^{28}$Si isotope, could be doped at approximately $10^{12}$ to $10^{14}$ cm$^{-3}$ with donors or acceptors and effectively used for atomic clock applications.

It should be noted that the theoretical modeling used to reproduce the splitting of the acceptor ground state predicts only a small energy shift to the transitions of individual donor impurities (and a splitting of the ground state for acceptors). The broadening observed spectroscopically is a result of statistical averaging over a large ensemble of impurities. Therefore, isolating individual donor impurity atoms in silicon crystals of natural isotopic composition would have a similar effect as removing the isotopic randomness. If laser light is used to excite the crystal and interrogate the resonance, this would mean that the laser frequency should be matched to the impurity transition. In principle, all the transitions of donors and acceptors in natural and isotopically-enriched silicon, including their hyperfine splitting, could be used to build an atomic clock.

Donors and acceptor impurities in silicon, with few exceptions such as the phosphorus $^{31}$P, come in different isotopes. For example, the most common acceptor, boron, has two isotopes in the natural occurrence $^{10}$B and $^{11}$B, with a ratio of 80% to 20%. The impurity atoms used could be in their natural occurrence or single isotope such as boron ($^{11}$B). There is a shift in the ionization energy for each of the isotopes; therefore, using single-isotope impurities may be desirable.

Figure 2A:
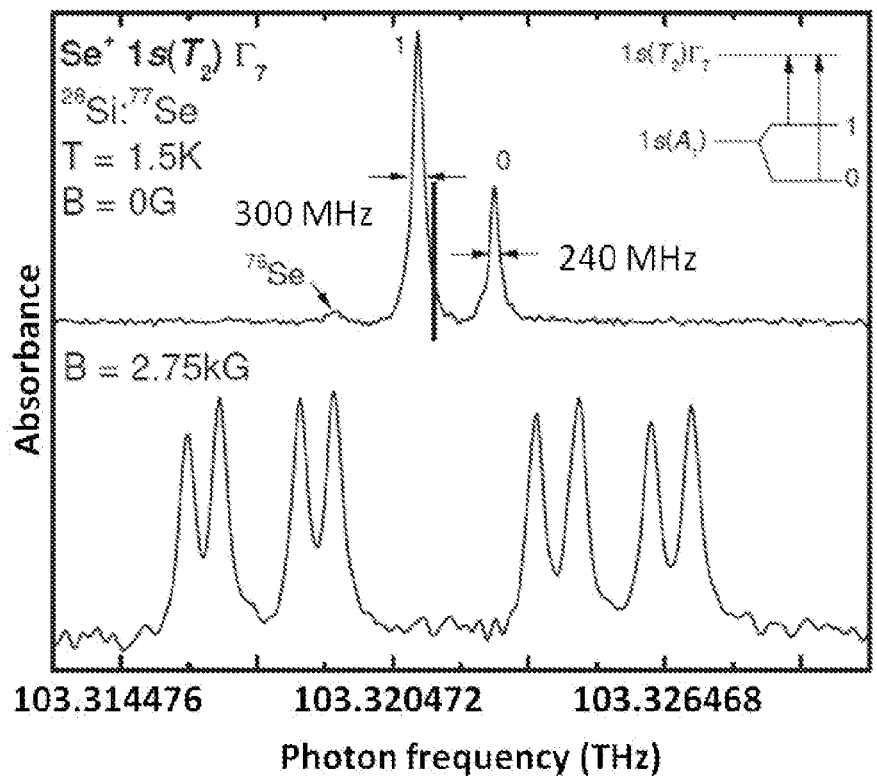
FIG. 2A is a graph that shows the spectra of $^{77}$Se$^+$ 1s(T$_2$)Γ$_7$ transition in $^{28}$Si.
Figure 2B:
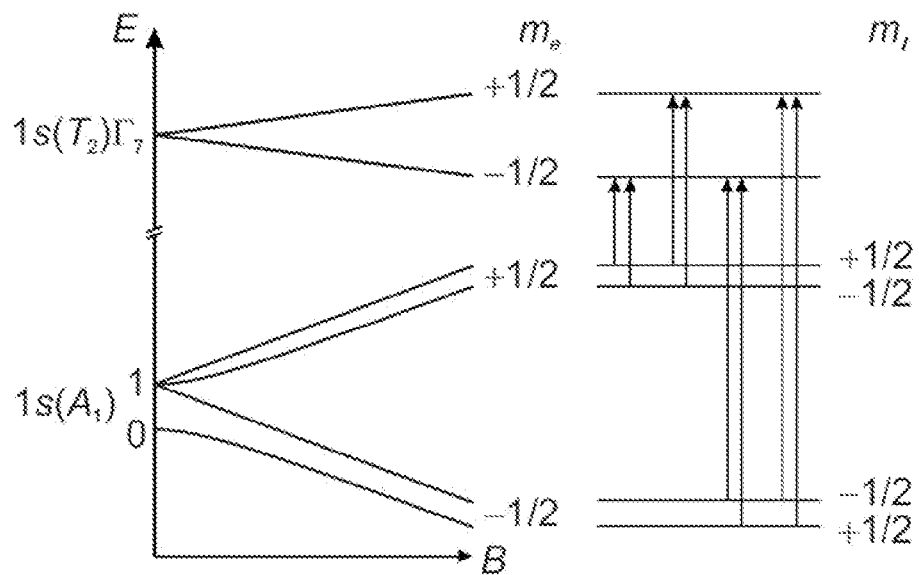
FIG. 2B is a level scheme describing the origin of the transitions of FIG. 2A.

FIG. 2A shows the spectra of the $^{77}$Se$^+$ 1s(T$_2$)$\Gamma_7$ transition in $^{28}$Si. Illustrated in the top of the figure are the spectra without an external magnetic field showing the ground-state hyperfine splitting. The spectra show extremely narrow lines with a FWHM of 240 MHz. Residuals of the $^{76}$Se are visible and the vertical line is located halfway between the $^{76}$Se and $^{78}$Se energies. In the bottom of the figure are the spectra under a 2750 G magnetic field. Four doublets are observed. FIG. 2B is a level diagram for the $^{77}$Se$^+$ 1s(T$_2$)$\Gamma_7$ transitions indicating the origin of the eight components shown in the bottom of FIG. 2A.

Impurity Transitions of Interest

Impurity transitions that can be used for atomic clock applications will now be described. Impurity atoms that contribute free electrons to the host crystal are known as donors, whereas atoms that remove electrons (or create holes) are known as acceptors. The transitions to be used as the frequency standard could originate from (1) a neutral donor or acceptor in natural or isotopically-enriched silicon or (2) excitons (electron-hole pairs) bound to neutral donors or acceptors in natural or isotopically-enriched silicon, called impurity bound excitons. Substitutional group-V atoms include phosphorus (P), arsenic (As), and antimony (Sb), and interstitial monovalent atoms include lithium (Li) and sodium (Na). The group-V atoms have one more valence electrons than the silicon atom they replace. Furthermore, this electron is loosely bound to the group-V atom in silicon so that it can be easily excited into the conduction band of the host silicon crystal. Substitutional group-VI atoms such as sulfur (S), selenium (Se), and tellurium (Te) can contribute up to two electrons and are known as double donors.

Boron (B), gallium (Ga), indium (In), and aluminum (Al) are shallow acceptors in silicon. All these atoms belong to group III of the periodical table and have one less valence electron than silicon. Therefore, when these atoms substitute a silicon atom they create a hole that is loosely bound to the negatively-charged acceptor. Substitutional group-II atoms such as beryllium (Be) and zinc (Zn) in silicon can contribute two positive charges to the host crystal and are called double acceptors. Deeper impurities like gold (Au), silver (Ag), platinum (Pt), and copper (Cu) are more likely to remain neutral at room temperature, and therefore can be ionized or neutralized using optical excitation.

Neutral Donor and Acceptor Transitions

The discrete states of the donor electron are classified according to their principal quantum number n, angular momentum I, and spin. In atomic physics, these states are denoted as 1s, 2s, 2p, etc. and similar notations are used to denote the bound states of shallow impurities. These transitions typically need to be interrogated in the far infrared.

Figure 3A:
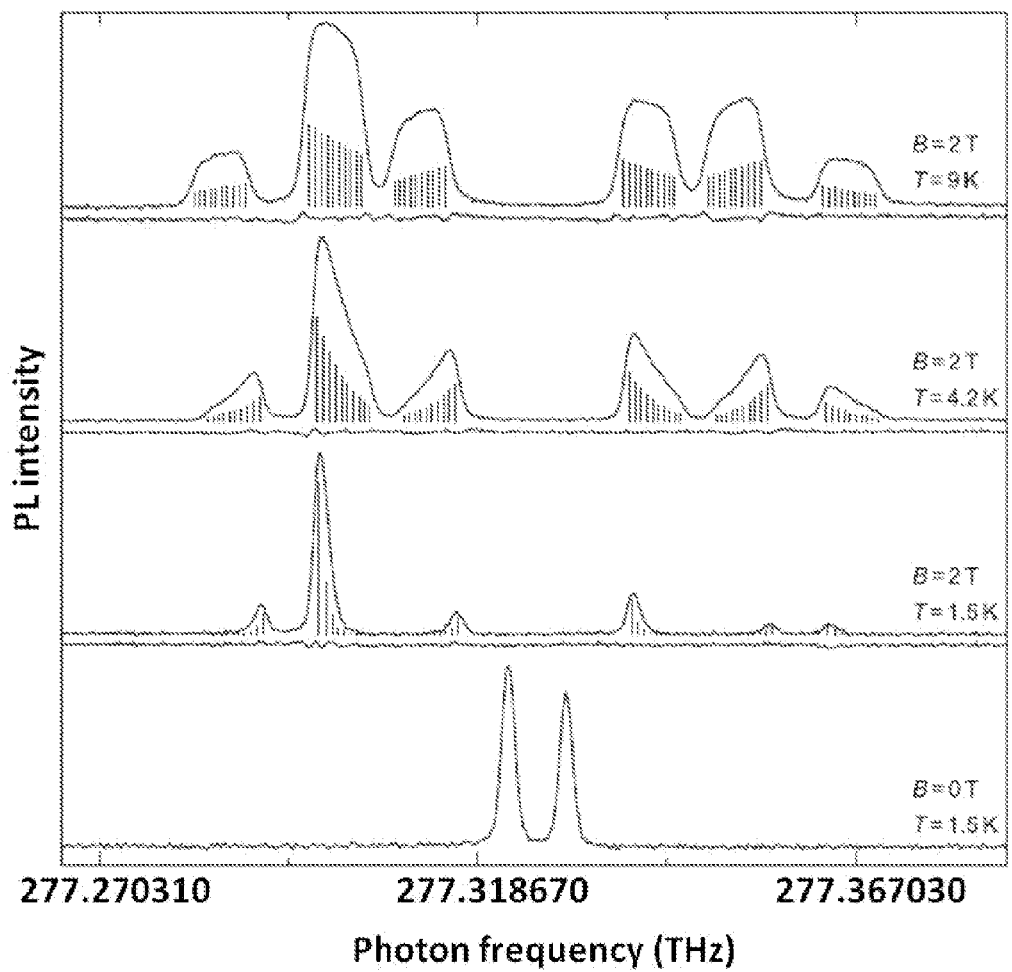
FIG. 3A is a graph of photoluminescence of bismuth no-phonon bound exciton D$^0$X transitions within single-isotope silicon at zero magnetic field and at 2 Tesla.
Figure 3B:
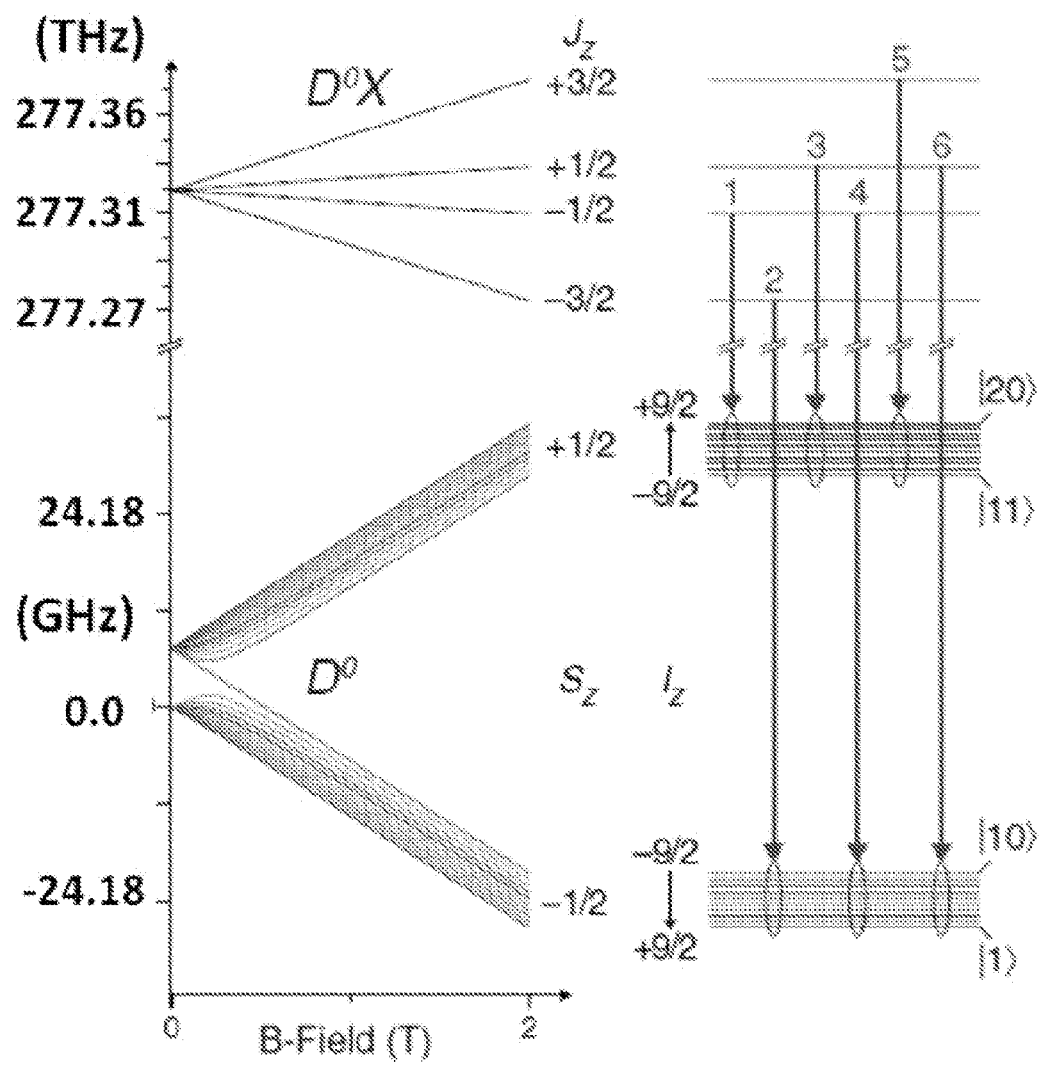
FIG. 3B is a level scheme describing the transitions of FIG. 3A indicating the origin of the photoluminescence structure at the zero and 2 Tesla magnetic fields.

FIG. 3A shows the photoluminescence of the bismuth (Bi) no-phonon bound exciton $D^0X$ transitions at zero magnetic field and at 2 Tesla for different temperatures. The vertical lines in the figure indicate the relative strengths of individual hyperfine components. FIG. 3B shows Zeeman level diagrams for the transitions from the bismuth bound exciton $D^0X$ to the neutral donor $D^0$ indicating the origin of the photoluminescence structure at zero and 2 Tesla magnetic field. $J_z$ identifies the hole angular momentum projections in $D^0X$, whereas $S_z$ and $I_z$ identify electron and nuclear spin projections in $D^0$, respectively. The allowed transitions at 2T are identified on the right in order of increasing energy, with each having 10 hyperfine components.

No-Phonon Transitions of Impurity Bound Excitons

When the silicon crystal contains a small number of donors and acceptors in their neutral state, the excitons will be attracted to these impurities. Because this attraction lowers the exciton energy, neutral impurities at low temperatures are very efficient at trapping excitons to form the impurity bound excitons. The impurity bound exciton is a multi-particle system. In the case of an exciton bound to donors, it comprises two interacting electrons and one hole, whereas in the case of one electron bound to a neutral acceptor, it comprises two interacting holes and one electron. In silicon, electrons at the conduction band minimum and holes at the valence band maximum can recombine by emission of a characteristic photon. Silicon is an indirect bandgap semiconductor, i.e., the maximum of the valence band and minimum of the conduction band are not at the same position in k-space. Therefore, electrons and holes can recombine and emit a photon with the help of k-vector conserving phonon. When a phonon fulfills the k-vector conservation requirement, the transition is called phonon assisted. However, it is possible for impurity bound excitons to have no-phonon transitions, i.e., transitions that do not invoke a k-vector conserving phonon. The spatial localization of the exciton to the impurity site in real space leads to a greater delocalization/diffusiveness of the electron and hole wave functions in k-space. This leads to an overlap of the electron and hole wave functions, thus permitting electron-hole transitions that conserve the k-vector. The intensity of no-phonon transitions will therefore increase with increasing localization energy.

Figure 4A:
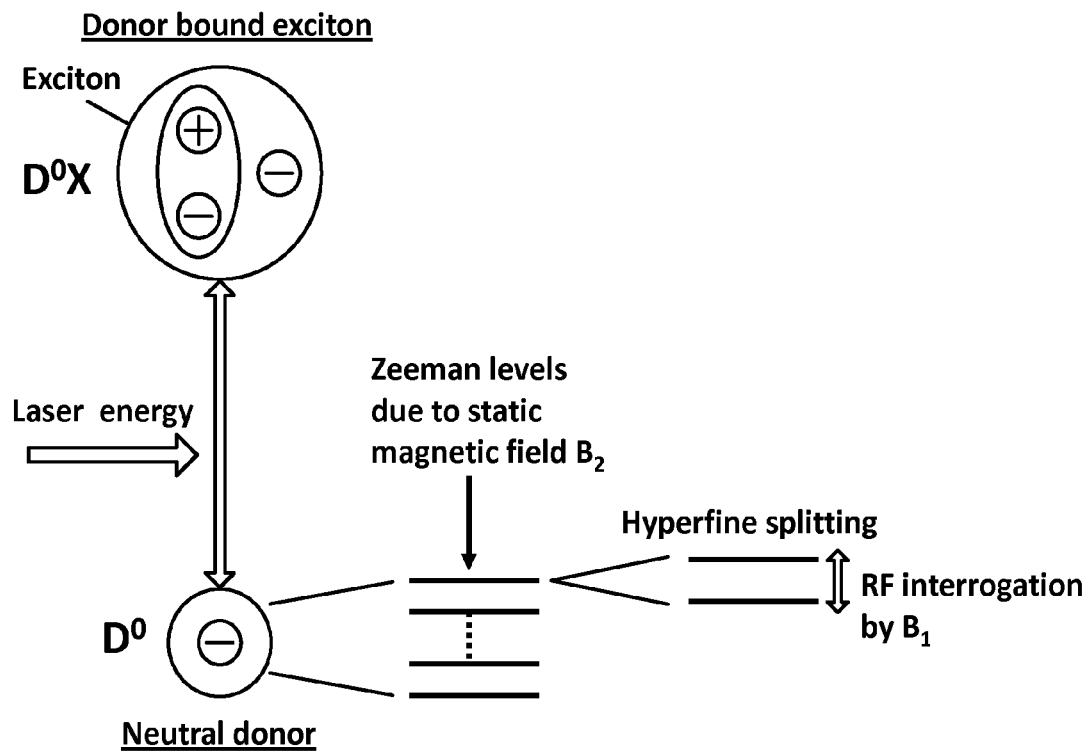
FIG. 4A is a schematic drawing that illustrates a no-phonon bound exciton transition that can be used to build an atomic clock.
Figure 4B:
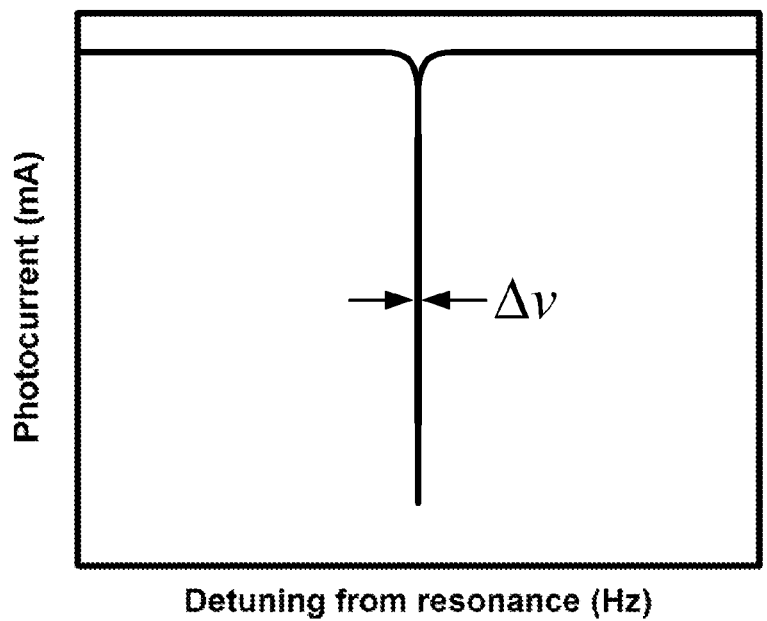
FIG. 4B is a graph of a measured photocurrent as a radio frequency (RF) is scanned over the hyperfine splitting shown in FIG. 4A.

FIG. 4A shows a schematic drawing of a no-phonon impurity bound exciton transition that may be used to build an atomic clock. The donor bound exciton is the excited state of the system, which can be optically excited by a frequency-stabilized laser, such as a vertical cavity surface-emitting laser (VCSEL). The Coulomb bound electron-hole pair recombines leaving the neutral donor behind. A small static magnetic field $B_2$ splits the donor ground state into its Zeeman sublevels, which are further split by the hyperfine interaction. A small coil can be used to provide a field (e.g., radio frequency (RF) field) $B_1$ that is used to interrogate the hyperfine resonance. FIG. 4B shows the measured photocurrent as the RF frequency is scanned over the hyperfine splitting frequency. The measure $\Delta v$ corresponds to the frequency width of the resonance.

Greater localization of the electrons and holes in real space implies greater delocalization/diffusiveness in k-space. As a result, deeper impurities with higher ionization energy will have stronger no-phonon transitions than shallower impurities. No-phonon transitions of impurity bound excitons in silicon can be exceedingly narrow. Phonon-assisted transitions will, in general, be broader than no-phonon transitions because of the dispersion in the phonon spectrum. In donor bound exciton transitions, one electron and hole forming the exciton recombine leaving a neutral donor behind, whereas in the acceptor bound exciton, one electron and hole recombine leaving a neutral acceptor behind. The neutral donor is split in the magnetic field into the projections of the electron spin $m_e=\pm\frac{1}{2}$, whereas the neutral acceptor is split according the hole angular momentum j=3/2. Therefore, acceptor bound exciton transitions have, in general, a more complicated structure. Because of the narrowing of the bound exciton transitions and the absence of the nuclear spin in isotopically enriched $^{28}Si$, the splitting because of hyperfine interactions with the nuclear spin of the impurity atom can be clearly resolved. Similar to atomic transitions, such as the rubidium (Rb) or cesium (Cs) standards, the hyperfine splitting of impurity bound exciton transitions in silicon can be used for atomic clocks.

Example Impurity Atoms for Atomic Clock Applications

Candidates for transitions will now be discussed. Donor bound exciton transitions are usually narrower than the acceptor counterparts and have a simpler structure. The phosphorus donor impurity can be easily introduced in silicon, making it a desirable impurity. The no-phonon homogeneous linewidth of the bound exciton in isotopically-pure silicon has been measured to be approximately 2.4 MHz at a magnetic field of 440 G, which is only twice the lifetime limited linewidth set by the $^{31}P$ bound exciton lifetime of 272 ns. The zero-field hyperfine splitting is 117.53 MHz, whereas at zero field, the linewidths amount to 70 neV. $^{31}P$ has a I=½ nuclear spin as compared to the I=3/2 for $^{87}Rb$ and I=7/2 for $^{133}Cs$, leading to a simpler hyperfine splitting. The phosphorus bound exciton transitions in isotopically enriched $^{28}Si$ and silicon of natural isotopic composition $^{nat}Si$ are shown in FIG. 1A. The difference between the spectra reveals the importance of the isotopic broadening. A schematic drawing describing the origin of the six doublets observed in $^{28}Si$ is also shown. Each doublet in the spectra is determined by the projections of the electron spin $m_e=\pm\frac{1}{2}$ and hole angular momentum j=3/2, whereas the doublet splitting is a result of the hyperfine interactions.

Another impurity with a significantly larger hyperfine splitting is the selenium double donor. Chalcogens such as selenium give rise to a number of different donor centers in silicon. These centers can involve one, two, or more selenium atoms and can be either neutral or ionized. Because of their deep nature, the 1s state can have transitions that are not observed for shallow donors. The donor atom occupying the tetrahedral lattice site has a six-fold degenerate s state, which can be split by the central cell potential into a singlet ($A_1$), a triplet ($T_2$), and a doublet (E) or ($\Gamma_6$), ($\Gamma_8$), and ($\Gamma_7+\Gamma_8$), including spin. The valley orbit splitting is strongest for the 1s state. The transition from the $1s(A_1)$ to $1s(T_2)$ is effectively mass theory forbidden, but symmetry allowed. The fact that this transition is only partially allowed contributes to its long lifetime and, therefore, to a narrow linewidth of approximately 240 MHz, making it possible to resolve the $^{77}Se$ hyperfine splitting using this final state. The hyperfine splitting would be obscured by the isotopic broadening in natural silicon and, therefore, is only observable in isotopically enriched $^{28}Si$. In addition, selenium has more than one isotope and the dopant itself has been enriched to 97.1% $^{77}Se$. The resolved hyperfine splitting at a zero magnetic field of 1.68 GHz and the resolved Zeeman component at a magnetic field of 2750 G are shown in FIG. 2A. The level diagram describing the individual transitions is included in FIG. 2B.

Bismuth (Bi) is the deepest group-V donor in silicon, with a binding energy of −71 meV. Furthermore, bismuth is monoisotopic ($^{209}Bi$) with a large I=9/2 nuclear spin and also a large hyperfine interaction of 1.475 GHz. At zero magnetic field, the neutral donor $D^0$ ground state is split into a doublet having total spins of 5 and 4, which are separated by 7.377 GHz, five times the hyperfine interaction. At a nonzero magnetic field, the donor bound exciton splits into six components according to the diagram shown in FIG. 3B, each of them having 10 hyperfine subcomponents. The six components under the magnetic field are determined by the electron spin and hole angular momentum analogous to the phosphorus donor.

Neutral and Ionized Impurities in Isotopically Pure Silicon

Impurities can be thermally or optically ionized, which involves removing the donor electron from the impurity center and leaving the positively charged (ionized) donor behind. Many impurities are thermally ionized at room temperature. Therefore, to maintain them, neutral cooling may be needed. Impurities that remain neutral at room temperature can be optically ionized by applying above-bandgap light to the crystal. The specifics of the optical ionization/neutralization depend on the doping level of donors and acceptors present in the crystal. However, turning on and off above-bandgap illumination provided by a laser can lead to ionization or neutralization of impurities. By ionizing the donors and removing hyperfine coupled electrons, the temperature dependence of the coherence time changes profoundly. For the phosphorus impurities in single-isotope silicon ($^{28}$Si), spin coherence times of four hours at cryogenic temperatures and thirty minutes at room temperatures have been observed. At room temperature, the coherence time corresponds to a resonance frequency width of 0.00055 Hz and quality factor of $Q=2.13 \times 10^{11}$. Achieving readout without significant broadening of the resonance by optical consecutive ionization/neutralization may lead to accurate atomic clock devices that are less sensitive to temperature.

Two-Photon Process within $^{28}$Si

Figure 5:
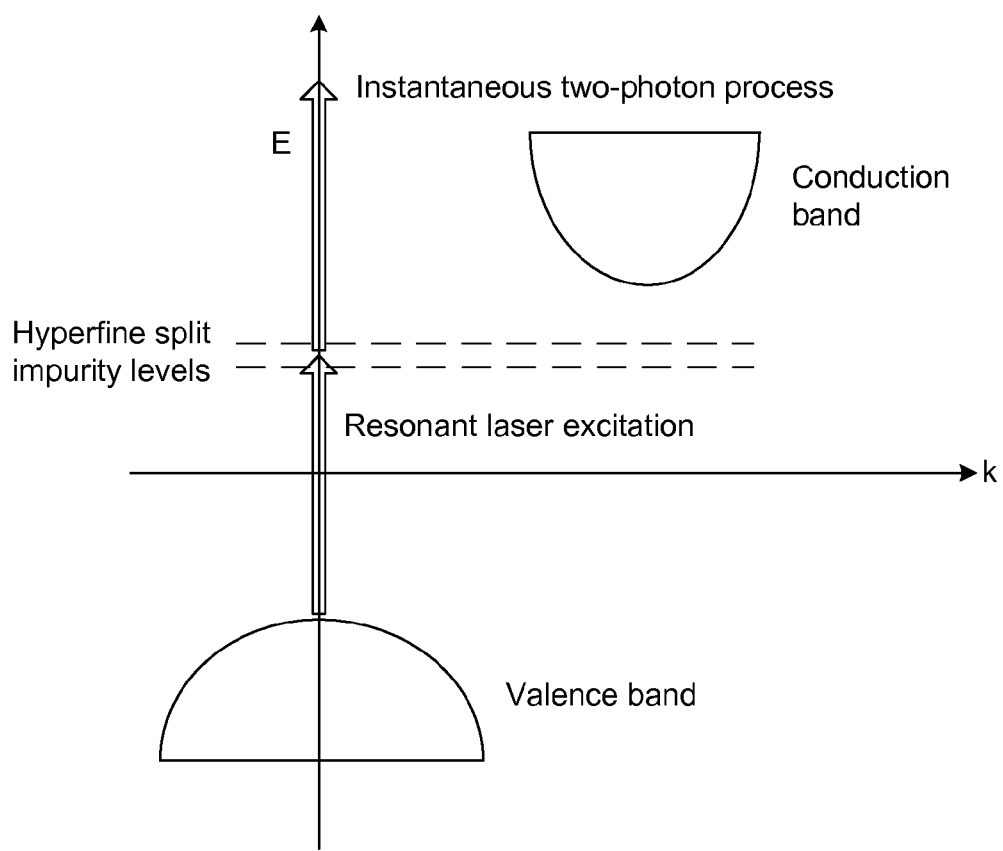
FIG. 5 is a schematic drawing that illustrates the two-photon process being within the sensitivity range of a $^{28}$Si photodetector device.

As shown in FIG. 5, the two-photon process within the $^{28}$Si crystal generates a photocurrent that is modulated by the frequency beating of the spin precession of the hyperfine split impurities transitions. FIG. 5 shows that the two-photon process within the $^{28}$Si crystal falls in the sensitivity range of the photodetector, and therefore, may be used to detect the hyperfine resonance within the photodetector. The single-photon process of the laser radiation on the $^{28}$Si does not generate a photocurrent since the energy is below the band gap and outside the sensitivity range of silicon-based photodetector devices. In such instances, the energy is below the photocurrent and outside the sensitivity range. However, the two-photon process within the $^{28}$Si crystal is above the band gap and is within the sensitivity range of the photodetector, as shown in FIG. 5. The resonance can be detected because the photocurrent generated by the two-photon process is modulated by the frequency beating of the spin precession of the hyperfine split impurity transitions.

This device may use the high sensitivity of a p-i-n photodiode, for example, in the visible spectral range to detect the hyperfine resonance within the photodiode making use of a rapid two-photon process. This scheme facilitates room temperature or thermoelectrically cooled operation.

Example Atomic Clock Using a Photodetector

Figure 6:
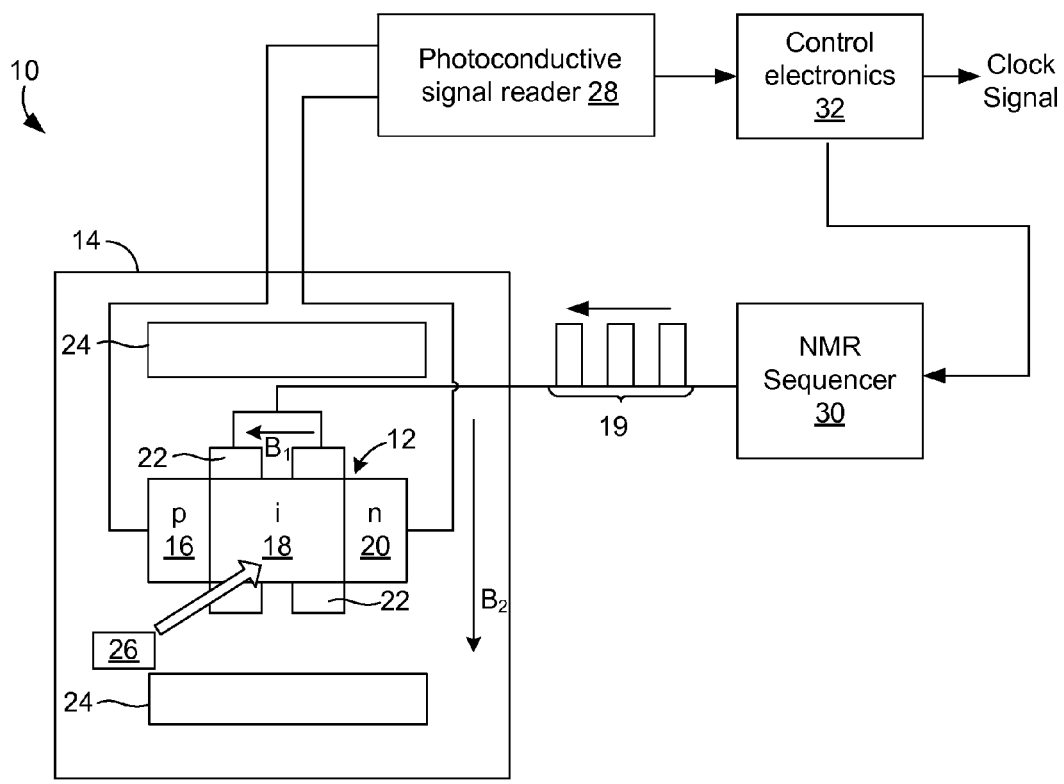
FIG. 6 is a block diagram of an embodiment of a photodetector based atomic clock.

FIG. 6 illustrates an example of an atomic clock 10 that can, for instance, be integrated into a compact (e.g., portable) electronic device. As shown in FIG. 6, the atomic clock 10 comprises a photodetector 12. In some embodiments, the photodetector 12 is contained within a temperature-controlled housing 14. The temperature-controlled housing 14 can be cooled by an appropriate cooling apparatus (not shown), such as, for example, a thermoelectric cooling apparatus or a liquid gas cooling apparatus. The temperature-controlled housing 14 may also be heated by a heater or a thermoelectric heating apparatus.

In FIG. 6, the photodetector 12 comprises a p-i-n diode that may be used as a photodetector. Specifically, the photodetector 12 of FIG. 6 comprises a p-type region 16, an intrinsic region 18, and an n-type region 20. The p-type region 16 is doped with acceptor impurities and the n-type region 20 is doped with donor impurities in order to facilitate the electrical current produced by the photodetector 12. The intrinsic region 18 of the photodetector 12 may comprise a single isotope $^{28}$Si crystal. In some embodiments, the intrinsic region of the photodetector 12 contains donors or acceptors commonly found in silicon crystals in the range of $10^{11}$-$10^{14}$ cm$^{-3}$. In some embodiments, the photodiode is biased. In other embodiments, the photodetector is not biased. However, biasing may accelerate the carriers to ensure that the impurities are ionized, thereby facilitating room-temperature operation of the atomic clock 10.

Although the photodetector 12 of FIG. 6 comprises a p-i-n diode, in other embodiments, the photodetector 12 may comprise a charge-coupled device (CCD), high performance complementary metal oxide semiconductor (CMOS) device, avalanche photodiode (APD), p-n junction photodiode, a phototransistor, a metal-semiconductor-metal (MSM) Schottky barrier photodiode, or other appropriate device comprising a single isotope $^{28}$Si crystal. In addition, in some embodiments, the p-type region 16 and n-type region 20 may be replaced by capacitor plates (not shown) that, as described below, can be used to detect the photocurrent generated by the two-photon process above the band gap.

The atomic clock 10 further comprises a first magnetic coil 22 that surrounds the photodetector 12. The first magnetic coil 22 generates a magnetic field $B_1$ which may be used to drive the hyperfine resonance of the impurities within the photodetector 12. The first magnetic coil 22 may be energized using a nuclear magnetic resonance (NMR) sequence 19 that comprises RF or microwave pulses. The resonance of the first magnetic coil 22 is used to generate an initial spin coherence of nuclei of the impurities within the photodetector 12.

In some embodiments, a second magnetic coil 24 may also surround the photodetector 12. The second magnetic coil 24 provides a static magnetic field $B_2$ that generates a small amount of Zeeman splitting of the impurity levels within the intrinsic region 18 of the photodetector 12. The magnetic field strength $B_2$ may be chosen such that $df/dB_2=0$ for the RF frequency f of the hyperfine resonance established by the first magnetic coil 22.

The atomic clock 10 further comprises a light source 26 that is configured to generate light used to excite the hyperfine level of the impurities within the photodetector 12. Specifically, the light source 26 may be modulated at a frequency of the hyperfine splitting of the impurities of the intrinsic region 18 of the photodetector 12. In some embodiments, the light source 26 is a laser, such as a vertical-cavity surface-emitting laser (VCSEL) or distributed feedback diode laser. In some embodiments, the laser may be modulated at the frequency f of the hyperfine splitting of the impurities of the photodetector 12, in order to generate coherent population trapping (CPT), making the first magnetic coil 22 $B_1$ redundant. In some embodiments, the light source 26 may be circularly polarized to ensure single electron spin excitation.

As is further shown in FIG. 6, the atomic clock 10 also comprises a photoconductive signal reader 28, an NMR sequencer 30, and control electronics 32. The photoconductive signal reader 28 connects to the output of the photodetector 12 and reads the photocurrent generated by the two-photon process of the photodetector 12. The NMR sequencer 30 generates the NMR sequences 19 for the first magnetic coil 22. The control electronics 32 receive signals from the photoconductive signal reader 28, provide control signals to the NMR sequencer 30, and output clock signals that are based at least in part on the photocurrent generated by the two-photon process of the photodetector 12. The output clock signals from the control electronics 32 can be provided to the associated electronic device.

During operation of the atomic clock 10, the photodetector 12 is maintained at a desired temperature within the housing 14, and a static magnetic field is applied to the photodetector 12 by the second magnetic coil 24. The light source 26 projects light onto the photodetector 12 to resonantly excite the hyperfine level of the impurities within the photodetector 12. The single-photon process of the light radiation does not generate a photocurrent since the energy is below band gap and outside the sensitivity range of silicon-based photodetector devices. However, energizing the first magnetic coil 22 with the NMR sequence 19 generated by the NMR sequencer 30 can cause the hyperfine splitting levels to resonate. Due to the combination of the resonating light produced by the light source 26 and the resonance generated by the NMR sequencer 30, a two-photon process occurs. The two-photon process within the $^{28}$Si intrinsic region 18 generates a photocurrent that occurs within the sensitivity range of the photodetector 12 (see FIG. 5). Accordingly, the photocurrent generated by the two-photon process is modulated by the frequency beating of the spin precession of the hyperfine split impurities transitions. This instantaneous two-photon process ensures that the spin coherences are not perturbed by the crystal environment or are only perturbed at a minimal degree. The photocurrent generated by the two-photon process can be read by the photoconductive signal reader 28. The photoconductive signal reader 28 can provide the reading to the control electronics 32, which can then generate a clock signal based upon the reading. In addition, the control electronics 32 can provide control signals to the NMR sequencer 30 to alter the NMR sequences 19 provided to the first magnetic coil 22.

In some embodiments, the light source 26 used to resonantly excite the hyperfine split impurity levels may be pulsed. The pulse duration may be in the nanosecond, picosecond, or femtosecond range at a high repetition rate. Pulsing the light emitted from the light source 26 ensures that the two-photon process is instantaneous.

In some embodiments, the impurities of interest may be kept ionized via temperature regulation, electric fields, and/or radiation through an additional light source. As such, the long nuclear coherence time of ionized impurities in single isotope $^{28}$Si advantageous for the accurate measurement of time.

Therefore, at least the following is claimed:

1. An atomic clock for use within an electronic device, the atomic clock comprising:
   a photodetector comprising a single-isotope silicon crystal doped with a plurality of impurity atoms, wherein a photocurrent generated via a two-photon process within the photodetector is used as a frequency resonance of the atomic clock.

2. The atomic clock of claim 1, wherein the photodetector is a p-i-n diode having an intrinsic region comprising a $^{28}$Si crystal.

3. The atomic clock of claim 1, further comprising a light source adapted to excite the impurity atoms within the photodetector.

4. The atomic clock of claim 3, wherein the light source generates a pulsing light, and wherein a duration between pulses of the pulsing light is one of the following: about a nanosecond, about a picosecond, or about a femtosecond.

5. The atomic clock of claim 3, wherein the light source is a laser being circularly polarized for single electron spin excitation.

6. The atomic clock of claim 1, further comprising a first magnetic coil surrounding at least a portion of the photodetector, wherein the first magnetic coil provides a first magnetic field to drive a hyperfine resonance of the impurities by generating an initial spin coherence of nuclei of the impurity atoms within the photodetector.

7. The atomic clock of claim 6, further comprising a sequencer coupled to the first magnetic coil, the sequencer configured to generate an electromagnetic pulse sequence to drive the hyperfine resonance of the impurities.

8. The atomic clock of claim 6, further comprising a second magnetic coil surrounding at least a portion of the photodetector, the second magnetic coil configured to provide a static magnetic field to generate a small Zeeman splitting of impurity levels of the plurality of impurity atoms.

9. The atomic clock of claim 1, wherein the plurality of impurity atoms are selected from the group consisting of: phosphorus (P), selenium (Se), and bismuth (Bi) atoms, and combinations thereof.

10. An electronic device comprising:
    an atomic clock comprising a photodetector comprising a single-isotope silicon crystal doped with a plurality of impurity atoms, a photocurrent generated by a two-photon process within the photodetector being used as a frequency resonance of the atomic clock.

11. The electronic device of claim 10, wherein the two-photon process is substantially instantaneous and a result of an excitation of hyperfine levels of the plurality of impurity atoms and a hyperfine resonance of the plurality of impurity atoms.

12. The electronic device of claim 10, wherein the photocurrent of the two-photon process is modulated by a frequency beating of a spin precession of hyperfine split impurity transitions of the plurality of impurity atoms.

13. The electronic device of claim 10, wherein the plurality of impurity atoms are selected from the group consisting of: phosphorus (P), arsenic (As), antimony (Sb), lithium (Li), sodium (Na), sulfur (S), selenium (Se), tellurium (Te), boron (B), gallium (Ga), indium (In), aluminum (Al), beryllium (Be), zinc (Zn), gold (Au), silver (Ag), platinum (Pt), bismuth (Bi), and copper (Cu) atoms, and combinations thereof.

14. The electronic device of claim 10, wherein the photodetector operates in a photoconductive mode or a photovoltaic mode.

15. A method for generating a clock signal, the method comprising:
    exciting, via at least one light source, a hyperfine level of impurity atoms within a photodetector comprising a single-isotope silicon crystal;
    generating a Zeeman splitting of the impurity levels of the impurity atoms;
    generating a hyperfine resonance of the impurity atoms based at least in part on a frequency applied to the photodetector that generates a spin coherence of nuclei of the impurity atoms;
    measuring a photocurrent of the photodetector, the photocurrent being generated by a two-photon process within the photodetector and modulated by a frequency beating of a spin precession of hyperfine split impurity transitions of the impurity atoms; and
    generating a clock signal based at least in part on the photocurrent.

16. The method of claim 15, wherein the single-isotope silicon crystal comprises a $^{28}$Si crystal.

17. The method of claim 15, wherein the photodetector comprises one of: a p-i-n photodiode, a charge-coupled device (CCD), a high performance complementary metal oxide semiconductor (CMOS) device, an avalanche photodiode (APD), a p-n junction photodiode, a phototransistor, or a metal-semiconductor-metal (MSM) Schottky barrier photodiode.

18. The method of claim 15, wherein the silicon crystal is doped with atoms selected from the group consisting of: phosphorus (P), arsenic (As), antimony (Sb), lithium (Li), sodium (Na), sulfur (S), selenium (Se), tellurium (Te), boron (B), gallium (Ga), indium (In), aluminum (Al), beryllium (Be), zinc (Zn), gold (Au), silver (Ag), platinum (Pt), bismuth (Bi), and copper (Cu) atoms, and combinations thereof.

19. The method of claim 15, wherein the silicon crystal is doped with atoms selected from the group consisting of: phosphorus (P), selenium (Se), and bismuth (Bi) atoms, and combinations thereof.

20. The method of claim 15, wherein the light source is modulated at a frequency of the hyperfine splitting of the impurity atoms to generate a coherent population trapping (CPT).

\* \* \* \* \*